United States Patent
Yoshida et al.

(10) Patent No.: US 6,518,632 B1
(45) Date of Patent: Feb. 11, 2003

(54) CERAMIC ELECTRONIC PART

(75) Inventors: Kazuhiro Yoshida, Shimane-ken (JP); Nobushige Moriwaki, Izumo (JP); Yasuhiko Kubota, Izumo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/493,988

(22) Filed: Jan. 28, 2000

(30) Foreign Application Priority Data

Jan. 29, 1999 (JP) .......................................... 11-021069

(51) Int. Cl.$^7$ ........................ H01L 29/76; H01L 29/94; H01L 31/062; H01L 31/113; H01L 31/119
(52) U.S. Cl. ..................... 257/393; 257/692; 257/730; 361/308.2
(58) Field of Search ................................ 257/692, 694, 257/696, 700, 703, 730, 732, 393; 361/308.2, 308.1, 306.1; 338/22 R, 309, 328, 332

(56) References Cited

U.S. PATENT DOCUMENTS

| | | | |
|---|---|---|---|
| 4,158,218 A | | 6/1979 | McLaurin et al. |
| 4,379,319 A | * | 4/1983 | Wilson ........................ 361/321 |
| 4,564,782 A | * | 1/1986 | Ogawa ........................ 310/359 |
| 5,075,665 A | * | 12/1991 | Taira et al. .................... 338/21 |
| 5,251,094 A | * | 10/1993 | Amano et al. ........... 361/308.2 |
| 5,590,016 A | * | 12/1996 | Fujishiro et al. ............. 361/313 |
| 6,081,416 A | * | 6/2000 | Trinh et al. .............. 361/308.1 |
| 6,191,933 B1 | * | 2/2001 | Ishigaki et al. .............. 361/309 |
| 6,380,619 B2 | * | 4/2002 | Ahiko et al. ................. 257/703 |

FOREIGN PATENT DOCUMENTS

| | | |
|---|---|---|
| DE | 19830820 A | 1/1999 |
| EP | 0243602 A | 11/1987 |
| JP | 62169317 | 7/1987 |
| JP | 245620 | 3/1990 |
| JP | 4313209 | 11/1992 |
| JP | 11-251179 | * 9/1999 |
| US | 4158218 A | 6/1979 |

OTHER PUBLICATIONS

Patent Abstracts of Japan vol. 016, No. 508 (E–1282), Oct. 20, 1992 & JP 04 188808A (Marcon Electron Co. Ltd.), Jul. 7, 1992 *Figs. 1–2* *abstract*.
Patent Abstracts of Japan vol. 1999, No. 05, May 31, 1999 & JP 11 040460 A (Murata Mfg. Co. Ltd.), Feb. 12, 1999 *abstract*.
Patent Abstracts of Japan vol. 1997, No. 10, Oct. 31, 1997 & JP 09 148174 A (Rohm Co. Ltd.) Jun. 6, 1997 *abstract*.
Patent Abstracts of Japan vol. 1997, No. 02, Feb. 28, 1997 & JP 08 273976 A (Murata Mfg. Co. Ltd.), Oct. 18, 1996 *abstract*.
European Search Report No date.

* cited by examiner

*Primary Examiner*—Elvin Enad
*Assistant Examiner*—Kyung S. Lee
(74) *Attorney, Agent, or Firm*—Keating & Bennett, LLP (57) ABSTRACT

A ceramic electronic part wherein widths of portions of external terminals that are joined to end surfaces of a ceramic electronic part element are made equal to or less than widths of internal electrodes disposed in the ceramic electronic part element. The joining portions of the external terminals are joined to the end surfaces of the ceramic electronic part element so as to be positioned within areas of the end surfaces of the ceramic electronic part element where the internal electrodes are exposed when viewed in a plane. The ceramic electronic part with the external terminal is a highly reliable one and makes it possible to prevent cracking of a ceramic part element even when the ceramic electronic part is large.

13 Claims, 13 Drawing Sheets

CERAMIC ELECTRONIC PART

BACKGROUND OF THE INVENTION

1. Field of the Invention

The present invention relates to a ceramic electronic part, and more particularly to a ceramic electronic part having a structure in which an external terminal, for being mounted to, for example, a base, is disposed on a surface of a ceramic electronic part element so as to be in electrical conduction with an internal electrode disposed in ceramic.

2. Description of the Related Art

Some ceramic electronic parts include external terminals for being mounted to, for example, bases. An example of such ceramic electronic parts including external terminals are shown in FIGS. 8A, 8B, and 8C, wherein metallic external terminals 55 are bonded with a bonding material 56, such as solder, an electrically conductive adhesive, or an electrically conductive paste, onto both end surfaces of a chip-type ceramic electronic part element 54 where external electrodes 53 are formed so as to be in electrical conduction with internal electrodes 52 disposed in ceramic 51.

Figure 9:
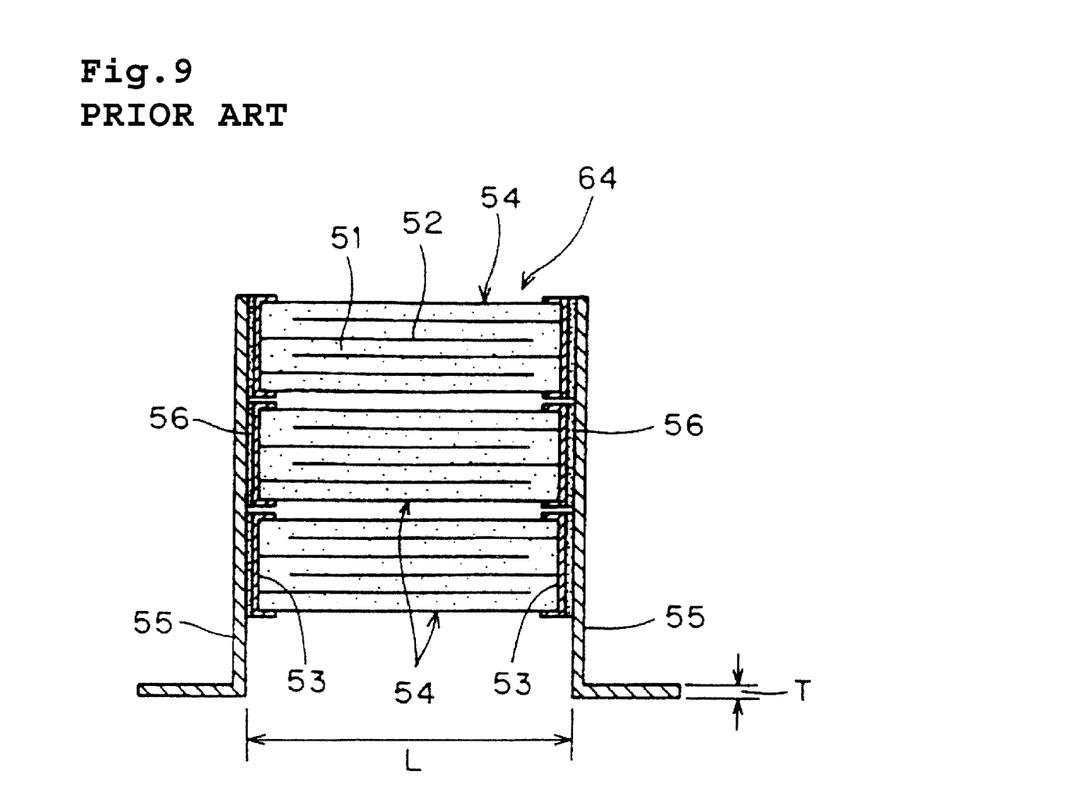
FIG. 9 is a front sectional view of another conventional ceramic electronic part.

In another example shown in FIG. 9, metallic external terminals 55 are bonded through a bonding material 56, such as solder, an electrically conductive adhesive, or an electrically conductive paste, onto a ceramic electronic part element 64 formed by stacking a plurality of chip-type electronic part elements 54 upon each other, where external electrodes 53 are formed so as to be in electrical conduction with internal electrodes 52 disposed in ceramic 51.

Figure 8A:
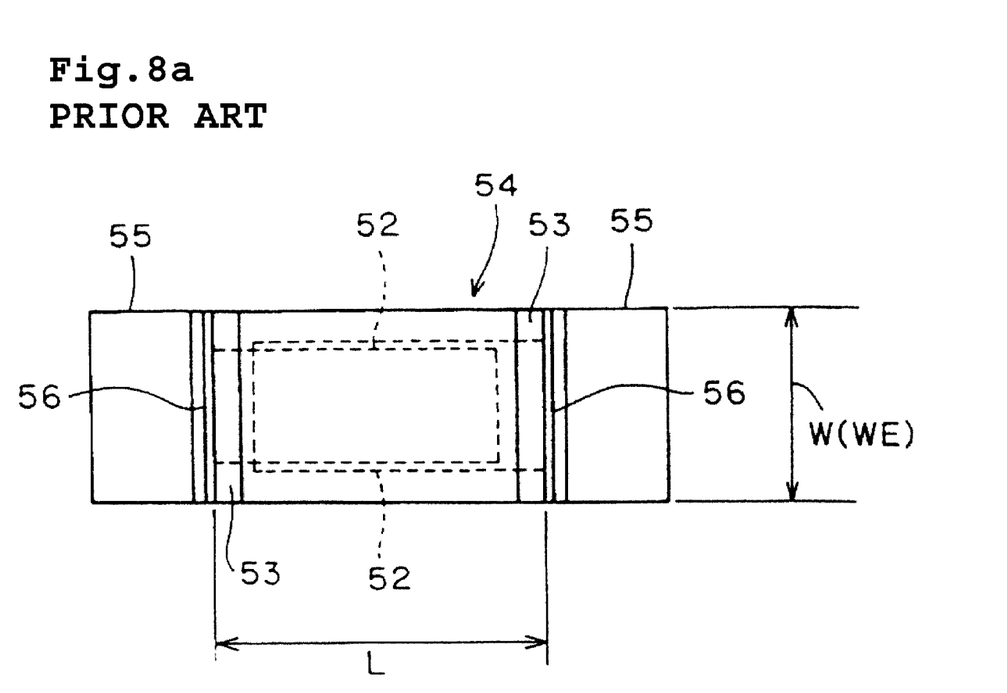
FIGS. 8A, 8B, and 8C are a plan view, a front sectional view, and a side view of a conventional ceramic electronic part.
Figure 8B:
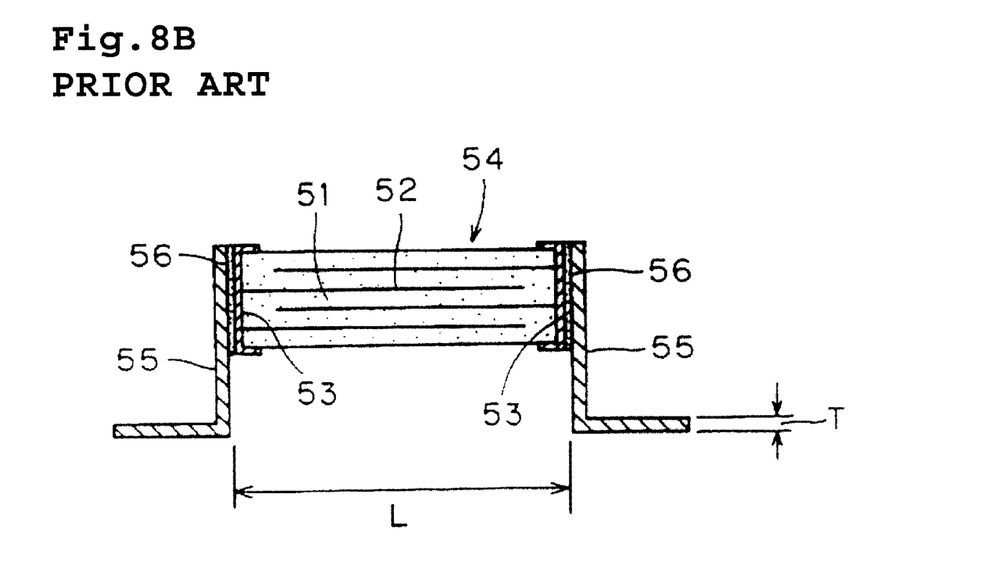
Figure 8C:
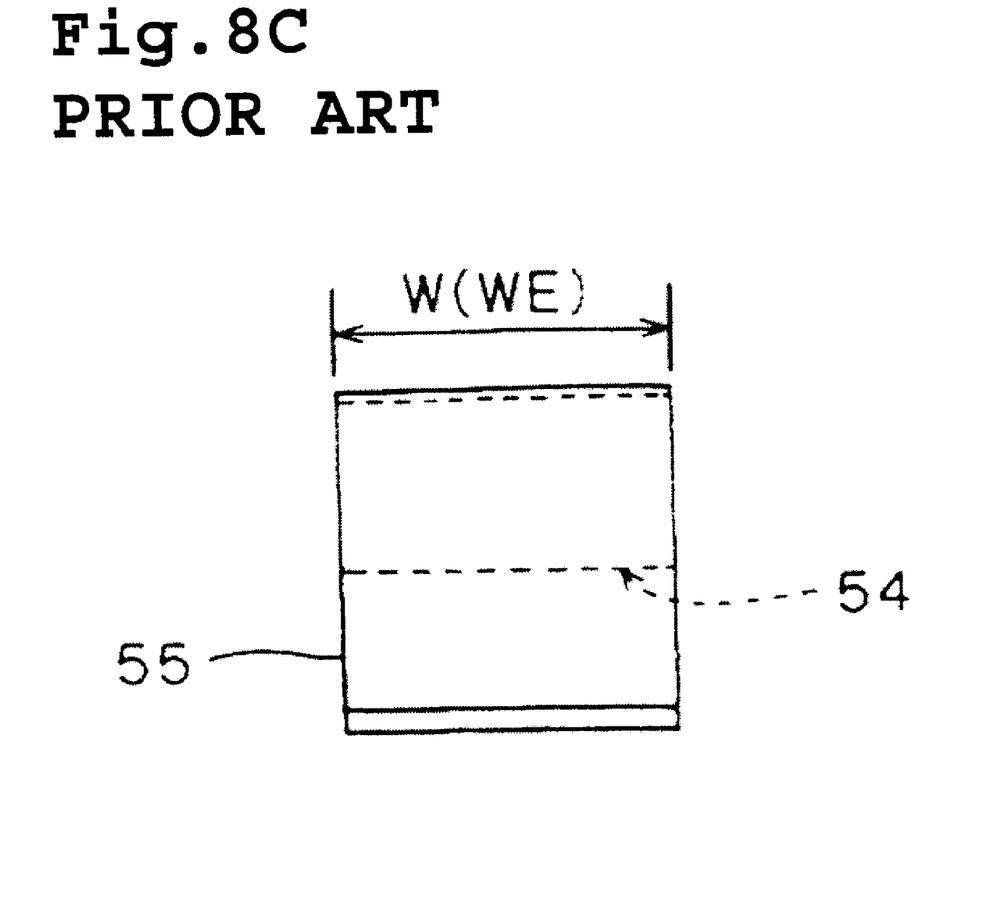

In general, the external terminals 55 shown in FIGS. 8A and 8C, having widths WE approximately equal to width W of the ceramic electronic part element 54 (64), are often used.

The use of such external terminals does not become a serious problem when the ceramic electronic parts whose external terminals 55 are bonded to the ceramic electronic part element 54 (64) are small. However, when the ceramic electronic parts are large with, for example, a length L or a width W (see FIGS. 8A to 8C and FIG. 9) equal to or greater than 10 mm, they are often used with a relatively high voltage and a large current, so that in order to make resistance values low the widths WE (see FIG. 8A) and thicknesses T (see FIGS. 8B and 9) of the external terminals 55 must be made large.

Figure 10:
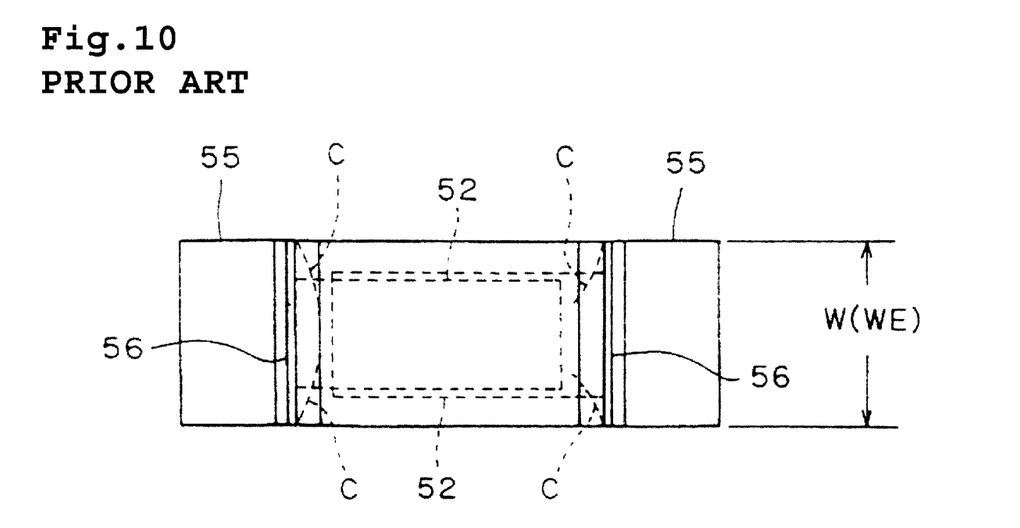
FIG. 10 is a plan view of a state in which the conventional ceramic electronic part is cracked.

In such a case, a noticeable amount of stress is produced due to a difference between the linear expansion coefficients of the ceramic electronic part element 54 (64) and those of the external terminals 55, so that a considerably large stress is exerted onto both end portions of the external terminals 55. For this reason, during, for example, a heat cycle test of the ceramic electronic parts, cracks C are produced in the ceramic electronic part element 54 (64), particularly at the sides where the temperature is low, as shown in FIG. 10.

SUMMARY OF THE INVENTION

To overcome the above-described problem, the present invention is able to provide a highly reliable ceramic electronic part with an external terminal, which eliminates the problem of cracks being produced in a ceramic electronic part element when the ceramic electronic part is large.

To this end, according to a first form of the present invention, there is provided a ceramic electronic part comprising:

a ceramic electronic part element constructed so that an internal electrode is disposed in ceramic, with a portion of the internal electrode being exposed from an end surface of the ceramic electronic part element; and an external terminal being a metallic plate joined to the end surface of the ceramic electronic part element so as to be in electrical conduction with the internal electrode exposed from the end surface of the ceramic electronic part element;

wherein a width of a portion of the external terminal that is joined to the end surface of the ceramic electronic part element is equal to or less than a width of the internal electrode disposed in the ceramic electronic part element.

When the width of the portion of the external terminal that is joined to the ceramic electronic part element is equal to or less than the width of the internal electrode, and the ceramic electronic part element has a complex structure including the ceramic and the internal electrode (metal), an external electrode can be joined to a portion having a linear expansion coefficient closer to the linear expansion coefficient of the metal than the linear expansion coefficient of a portion including only the ceramic. Therefore, it is possible to reduce cracking as a result of reducing the amount of stress produced in a heat cycle test.

In the present invention, the phrase "joining an external terminal to an end surface of a ceramic electronic part element" is to be broadly interpreted as also meaning, for example, directly joining an external terminal to an end surface of a ceramic electronic part element, or joining an external terminal onto an end surface of a ceramic part element through, for example, a bonding material, such as solder, an electrically conductive adhesive, or an electrically conductive paste, and/or joining the external terminal to an external electrode formed on the end surface of the ceramic electronic part element in conductive connection with the internal electrode.

According to a second form of the present invention, the joining portion of the external terminal may be joined to the end surface of the ceramic electronic part element so as to be positioned within an area of the end surface of the ceramic electronic part element where the internal electrode is exposed when viewed in a plane.

When an external electrode is joined to an end surface of the ceramic electronic part element so that the joining portion of the external terminal is positioned within the area of the end surface of the ceramic electronic part element where the internal electrode is exposed when viewed in a plane, the external terminal can be reliably joined to a portion having a linear expansion coefficient closer to the linear expansion coefficient of a metal than the linear expansion coefficient of a portion including only ceramic. Therefore, the present invention can provide more satisfactory practical results.

According to a third form of the present invention, when a width of a portion of the external terminal that is joined to the end surface of the ceramic electronic part element is equal to or less than a width of the internal electrode disposed in the ceramic electronic part element, or when the joining portion of the external terminal is joined to the end surface of the ceramic electronic part element so as to be positioned within an area of the end surface of the ceramic electronic part element where the internal electrode is exposed when viewed in a plane, the ceramic electronic part element may be formed by stacking a plurality of ceramic electronic part elements upon each other.

Here, it is possible to use a type of ceramic electronic part known as a stacked-type ceramic electronic part formed by stacking a plurality of ceramic electronic part elements upon each other. Even in this case, it is possible to reduce the amount of stress generated in a heat cycle test in order to reduce cracking.

According to a fourth form of the present invention, when a width of a portion of the external terminal that is joined to the end surface of the ceramic electronic part element is equal to or less than a width of the internal electrode disposed in the ceramic electronic part element, or when the joining portion of the external terminal is joined to the end surface of the ceramic electronic part element so as to be positioned within an area of the end surface of the ceramic electronic part element where the internal electrode is exposed when viewed in a plane, or when the ceramic electronic part element is formed by stacking a plurality of ceramic electronic part elements upon each other, a width of at least a portion of the external terminal other than the joining portion that is joined to the ceramic electronic part element may be made larger than the width of the internal electrode disposed in the ceramic electronic part element.

When the width of at least a portion of the external terminal other than the joining portion that is joined to the ceramic electronic part element (that is, the width of a portion of the external terminal that is joined to a land of a base when the ceramic electronic part is to be mounted to the base) is made larger than the width of the internal electrode disposed in the ceramic electronic part element, the area of the external terminal joined to the land can be made larger to achieve more reliable mounting, making it possible to design the ceramic electronic part with more freedom while maintaining its reliability.

According to a fifth form of the present invention, when a width of a portion of the external terminal that is joined to the end surface of the ceramic electronic part element is equal to or less than a width of the internal electrode disposed in the ceramic electronic part element, or when the joining portion of the external terminal is joined to the end surface of the ceramic electronic part element so as to be positioned within an area of the end surface of the ceramic electronic part element where the internal electrode is exposed when viewed in a plane, or when the ceramic electronic part element is formed by stacking a plurality of ceramic electronic part elements upon each other, or when a width of at least a portion of the external terminal other than the joining portion that is joined to the ceramic electronic part element is made larger than the width of the internal electrode disposed in the ceramic electronic part element, the form of the ceramic electronic part element when viewed in a plane may be such that a length (width) W of a side A of the end surface to which the external terminal is mounted is greater than a length L of a side B perpendicular to the side A.

When the form of the ceramic electronic part element when viewed in a plane is such that the length (width) W of the side A of the end surface to which the external terminal is mounted is larger than the length L of the side B that is perpendicular to the side A, stress is often produced between the external terminal and the ceramic electronic part element, so that cracks are often produced. However, when the present invention is applied to such a ceramic electronic part, cracking can be reduced, making the ceramic electronic part highly reliable. Therefore, it is particularly worthwhile to apply the present invention to such a ceramic electronic part.

Other features and advantages of the present invention will become apparent from the following description of embodiments of the invention which refers to the accompanying drawings.

DESCRIPTION OF EMBODIMENTS OF THE INVENTION

Hereunder, a detailed description will be given of the features of embodiments of the present invention.

First Embodiment

Figure 1A:
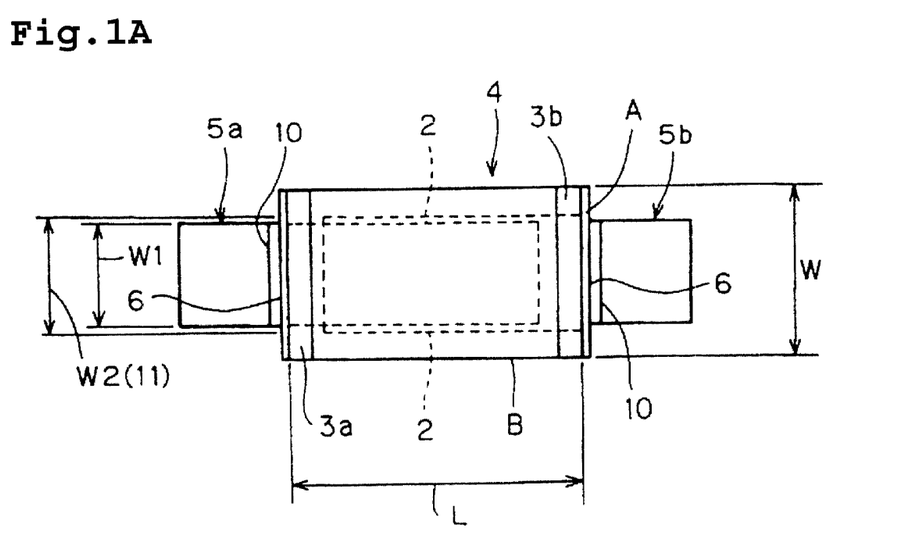
FIGS. 1A, 1B, and 1C are a plan view, a front sectional view, and a side view of an embodiment (a first embodiment) of the ceramic electronic part in accordance with the present invention.
Figure 1B:
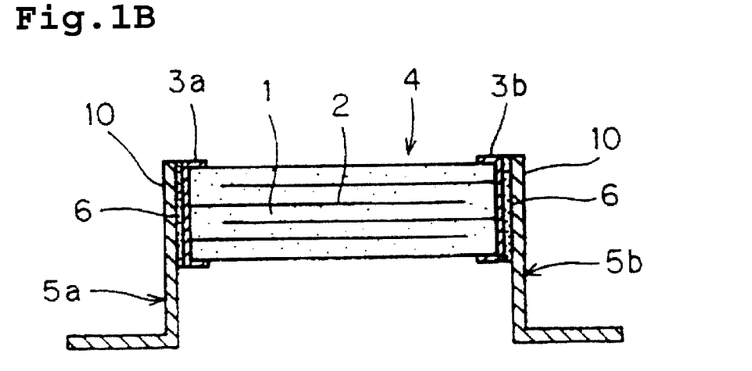
Figure 1C:
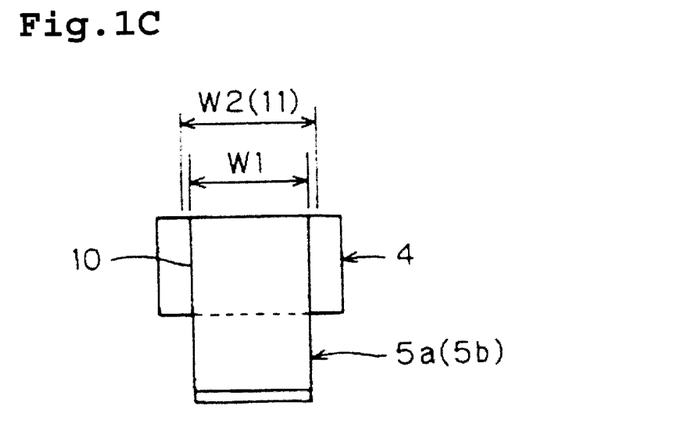

FIGS. 1A, 1B, and 1C are a plan view, a front sectional view, and a side view of one embodiment of the ceramic electronic part in accordance with the present invention (with a layered ceramic capacitor being used in this embodiment).

As shown in FIGS. 1A to 1C, in the ceramic electronic part (layered ceramic capacitor), a plurality of internal electrodes 2 are disposed in ceramic (a ceramic layer) 1 so as to oppose each other, and external electrodes 3a and 3b are formed on end surfaces of a ceramic electronic part element 4 having a structure in which ends of the internal electrodes 2 are alternately extended to opposite end surface sides of the ceramic electronic part element 4. The external electrodes 3a and 3b are in electrical conduction with the exposed internal electrodes 2. External terminals 5a and 5b formed by bending metallic plates (such as silver plates) into an L shape are bonded to the external electrodes 3a and 3b with a bonding material 6, such as solder, an electrically conductive adhesive, or an electrically conductive paste.

The form of the ceramic electronic part element 4 when viewed in a plane is such that widths W of sides A of end surfaces to which the external terminals 5a and 5b are mounted are smaller than lengths L of sides B that are perpendicular to the sides A.

In the embodiment, widths W1 of portions 10 of the external terminals 5a and 5b that are joined to the end surfaces of the ceramic electronic part element 4 are equal to or less than widths W2 of the internal electrodes (and/or extending portions of the internal electrodes 2—this foregoing information in parenthesis is omitted below) disposed in the ceramic electronic part element 4, and the joining portions 10 of the external terminals 5a and 5b are joined to the end surfaces of the ceramic electronic part element 4 so as to be disposed within areas 11 of the end surfaces of the ceramic electronic part element 4 where the internal electrodes 2 are exposed, when it is viewed in a plane. End portions of the external terminals 5a and 5b that are connected to a land (not shown) of a base are bent outward.

As described above, in the ceramic electronic part of the embodiment, the widths W1 of the joining portions 10 of the external terminals 5a and 5b are equal to or less than the widths W2 of the internal electrodes 2. Therefore, when the ceramic electronic part element 4 has a complex structure including the ceramic (ceramic layer) 1 and the internal electrodes (metals) 2, the external terminals 5a and 5b can be joined to portions (within the areas 11 of the side surfaces of the ceramic electronic part element 4 where the internal electrodes 2 are exposed, when viewed in a plane) having linear expansion coefficients closer to the linear expansion coefficients of metals (or the internal electrodes) than the linear expansion coefficients of portions including only ceramic. This reduces the amount of stress produced in a heat cycle test, so that even when a large ceramic electronic part including a ceramic electronic part element 4 with length L or width W equal to or greater than 10 mm is used, it is possible to reduce cracking.

Figure 2A:
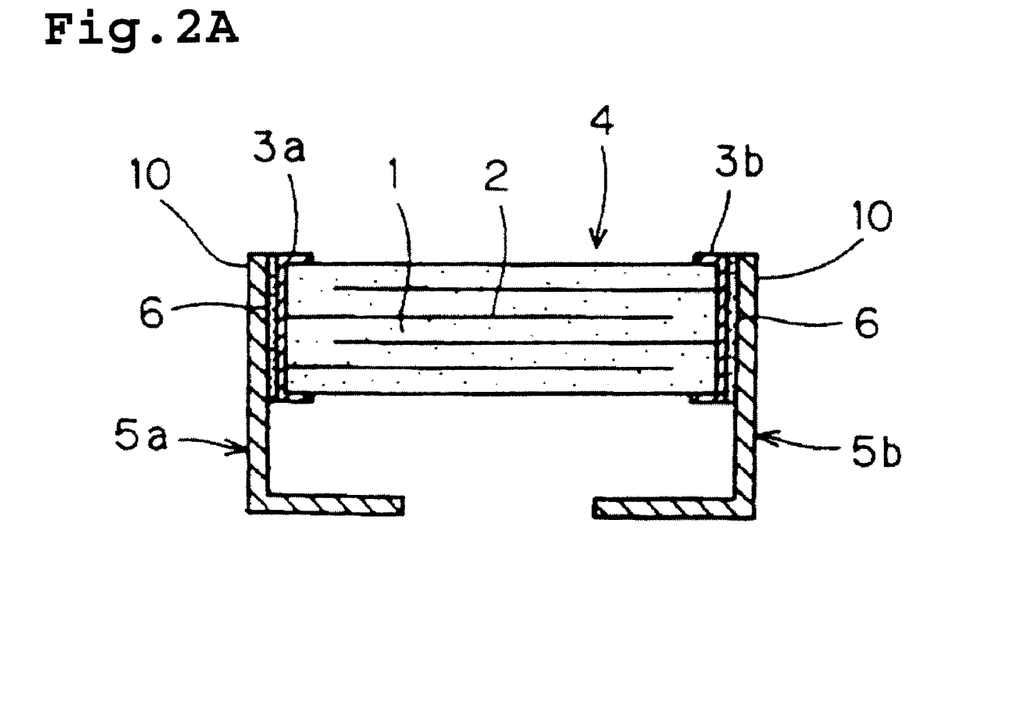
FIGS. 2A and 2B are a front sectional view and a side view of a modification of the first embodiment of the ceramic electronic part in accordance with the present invention.
Figure 2B:
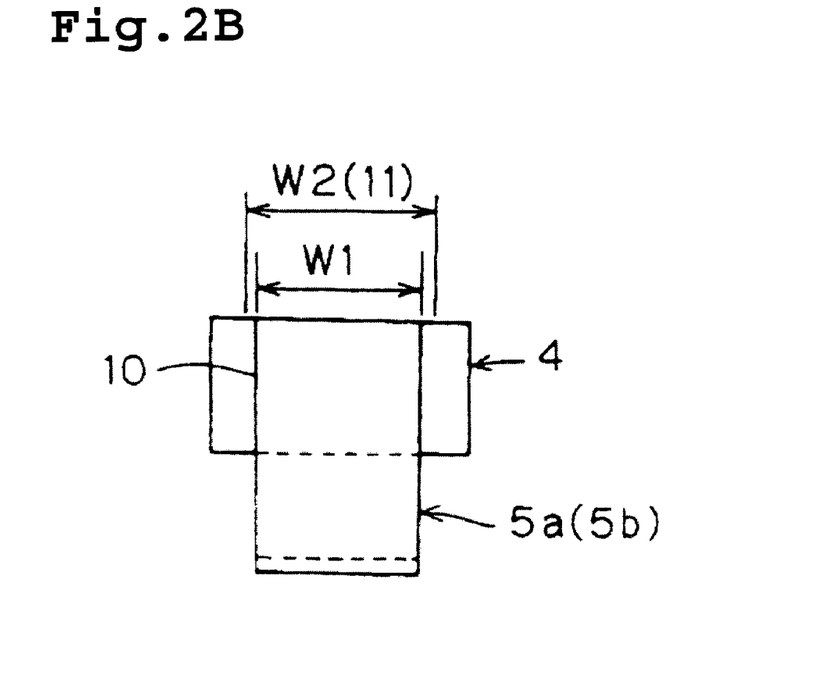

Although in the above-described embodiment the end portions of the external terminals 5a and 5b connected to a land (not shown) of a base are bent outward, the end portions of the external terminals 5a and 5b can be bent inward, as shown in FIGS. 2A and 2B. In this case the area of the ceramic electronic part when viewed in a plane becomes smaller, making it possible to achieve high-density mounting.

Figure 2C:
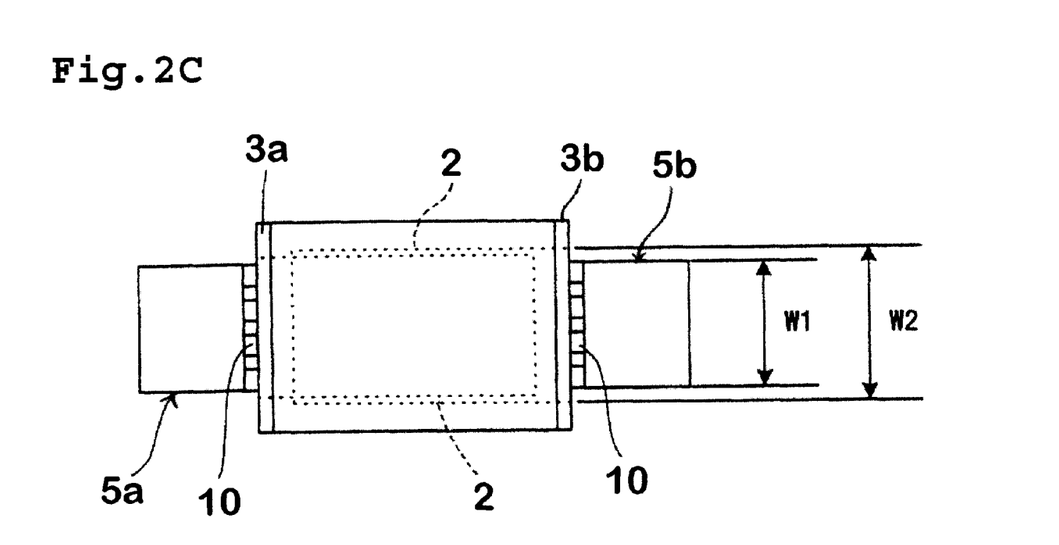
FIGS. 2C and 2D are a plan view and a side view of another modification of the first embodiment of the ceramic electronic part in accordance with the present invention.
Figure 2D:
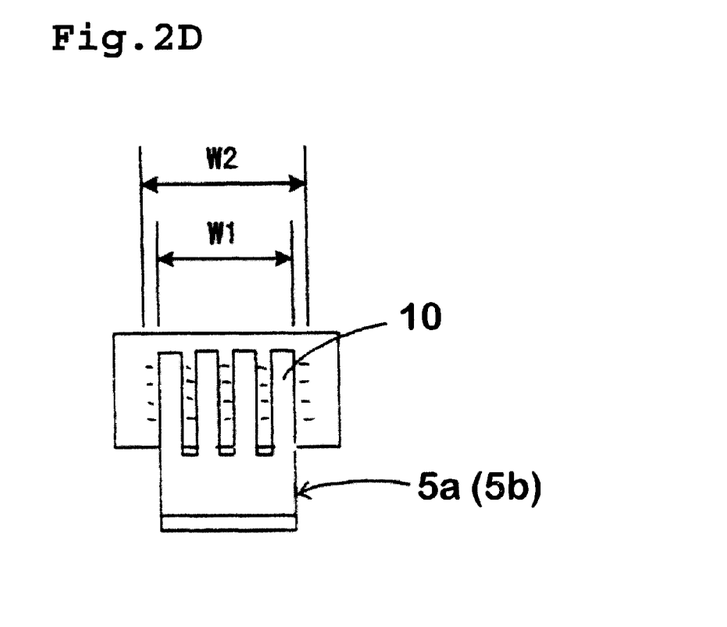

Further, as shown in FIGS. 2C and 2D, a connection portion 10 of the external electrode 5a (5b) can be provided with cut-outs. In such an embodiment, the connected area is reduced and the mechanical stress is decreased. Therefore, external terminals having larger thickness can be connected and the strength of the terminal is improved.

Figure 3A:
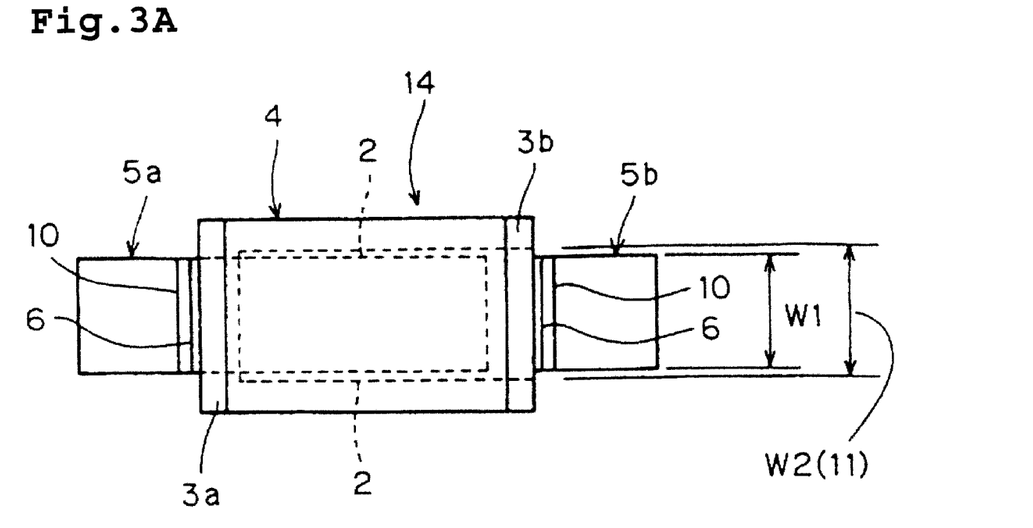
FIGS. 3A, 3B, and 3C are a plan view, a front sectional view, and a side view of another modification of the first embodiment of the ceramic electronic part in accordance with the present invention.
Figure 3B:
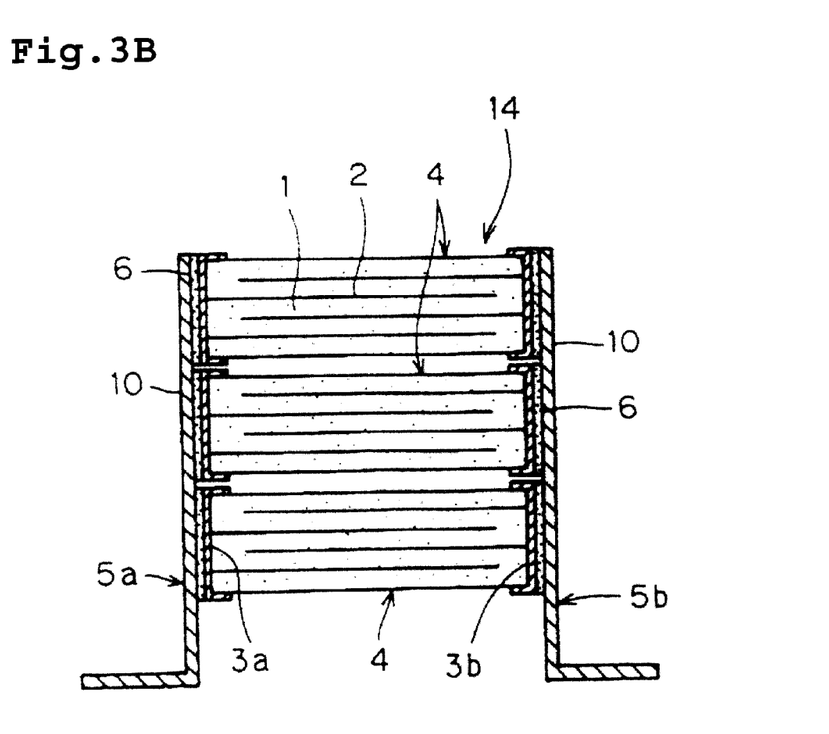
Figure 3C:
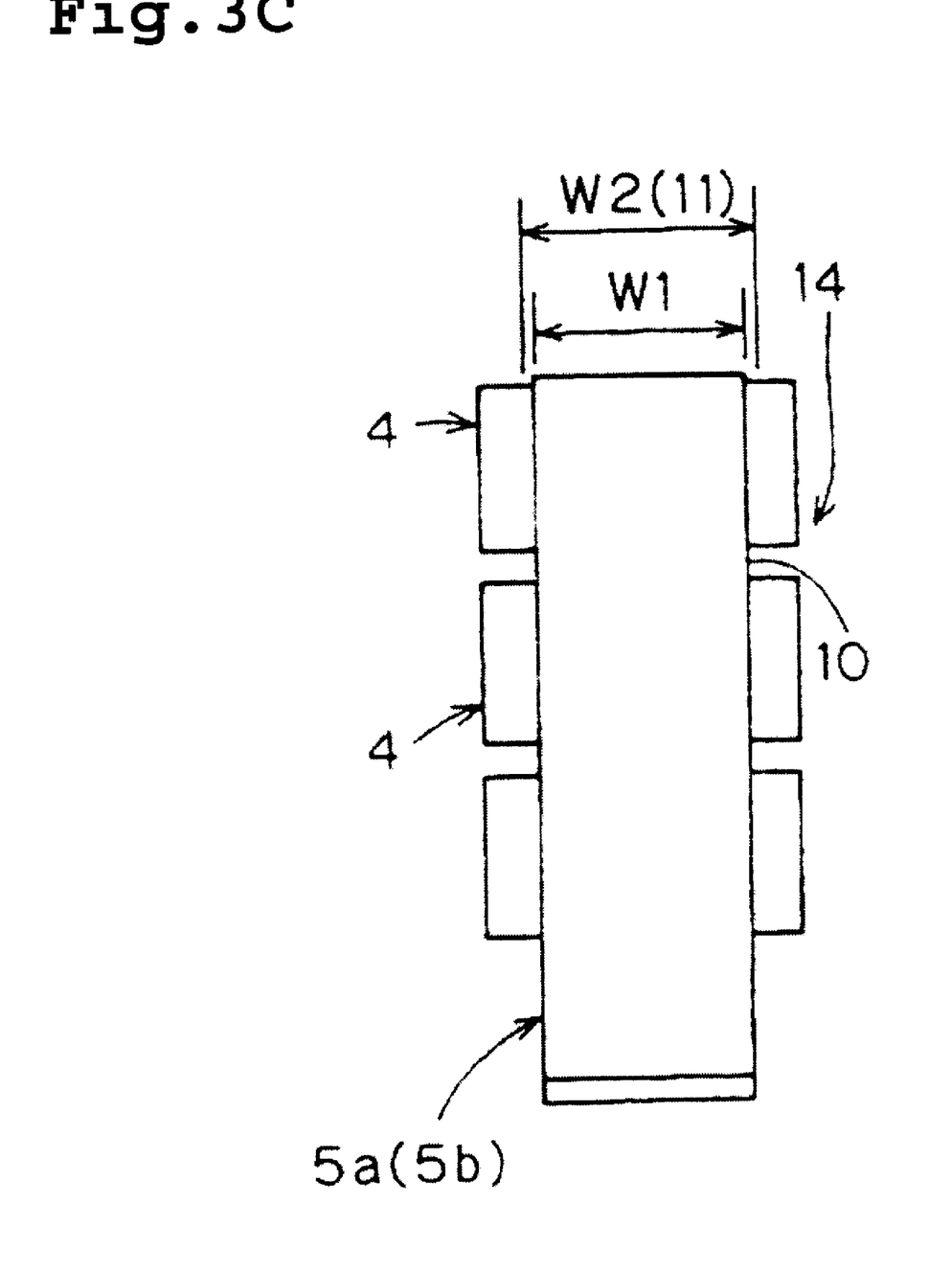

In addition, although in the above-described embodiment a ceramic electronic part in which external terminals are mounted to both end surfaces of one ceramic electronic part element is described, a stacked-type ceramic electronic part, shown in FIGS. 3A, 3B, and 3C, may also be used. The stacked-type ceramic electronic part is formed by joining portions 10 of external terminals 5a and 5b to both end surfaces of a stacked-type ceramic electronic part element 14 formed by stacking a plurality of ceramic electronic part elements 4 upon each other (in this embodiment, three ceramic electronic part elements 4), with the joining portions 10 of the external terminals 5a and 5b having widths W1 equal to or less than widths W2 of the internal electrodes 2 disposed in the ceramic electronic part element 14.

Second Embodiment

Figure 4A:
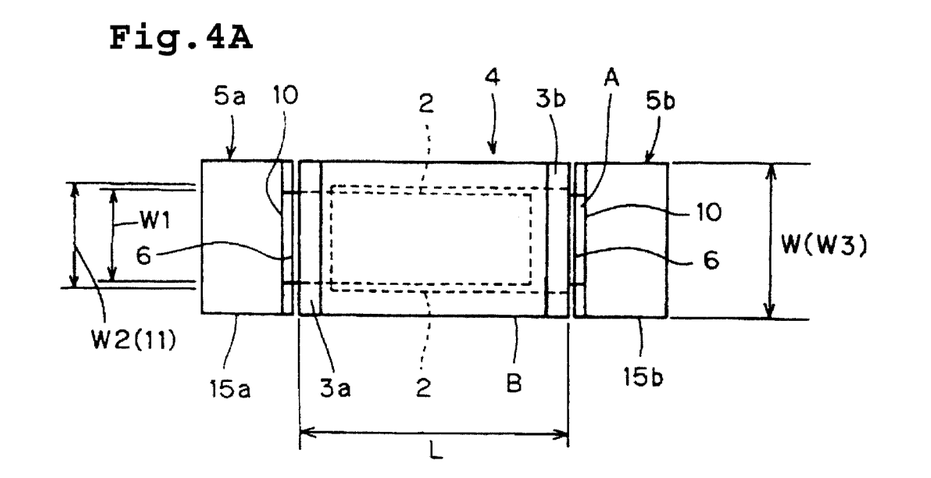
FIGS. 4A, 4B, and 4C are a plan view, a front sectional view, and a side view of another embodiment (a second embodiment) of the ceramic electronic part in accordance with the present invention.
Figure 4B:
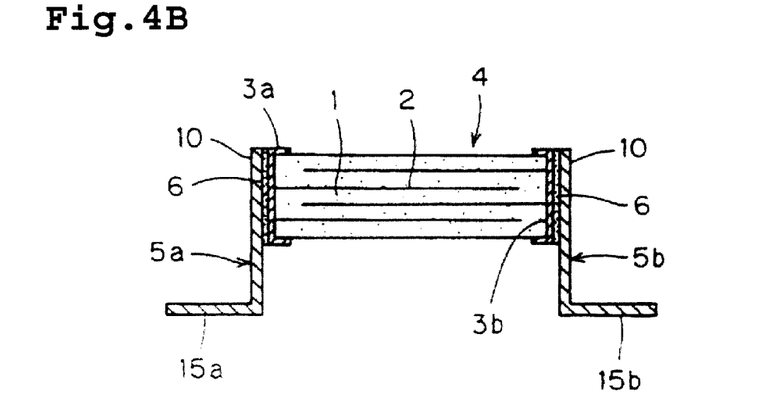
Figure 4C:
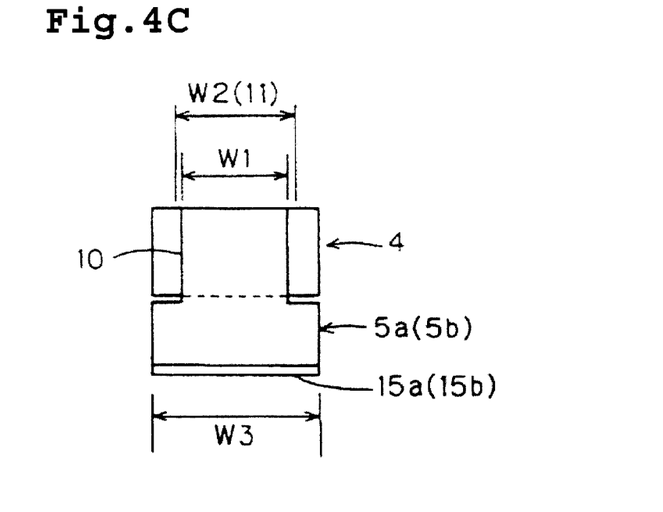

FIGS. 4A, 4B, and 4C are a plan view, a front sectional view, and a side view of another embodiment of the ceramic electronic part in accordance with the present invention (the ceramic electronic part of the embodiment being a layered ceramic capacitor).

In the ceramic electronic part, widths W1 of portions 10 of external terminals 5a and 5b that are joined to end surfaces of a ceramic electronic part element 4 are equal to or less than widths W2 of internal electrodes 2 disposed in the ceramic electronic part element 4, and widths W3 of portions of the external terminals 5a and 5b other than the joining portions 10 joined to the ceramic electronic part element 4 are larger than the widths W2 of the internal electrodes 2 disposed in the ceramic electronic part element 4 and larger than the widths W1 of the portions 10. (In the embodiment, the widthwise dimensions of the external terminals 5a and 5b are approximately equal to the widthwise dimension of the element 4.)

The other structural features of the ceramic electronic part are essentially the same as those of the ceramic electronic part of the first embodiment, so that descriptions thereof will not be given below to avoid unnecessary repetition.

In the ceramic electronic part of the embodiment, the widths W1 of the portions 10 of the external terminals 5a and 5b that are joined to the end surfaces of the ceramic electronic part element 4 are smaller than the widths W2 of the internal electrodes 2, so that, similarly to the ceramic electronic part of the first embodiment, it is possible to reduce cracking as a result of reducing the amount of stress produced in a heat cycle test. In addition, the widths W3 of the portions of the external terminals 5a and 5b other than the joining portions 10 that are joined to the ceramic electronic part element 4 are made larger than the widths W2 of the internal electrodes 2 (in the embodiment, the widthwise dimensions of the external terminals 5a and 5b are approximately equal to the widthwise dimension of the element 4), so that when, for example, (horizontal) portions 15a and 15b formed by bending end sides of the external terminals 5a and 5b are to be joined to a land (not shown) of a base, the joining area can be made large to achieve a more reliable mounting operation, making it possible to design the ceramic electronic part with greater freedom while maintaining its reliability.

Figure 5A:
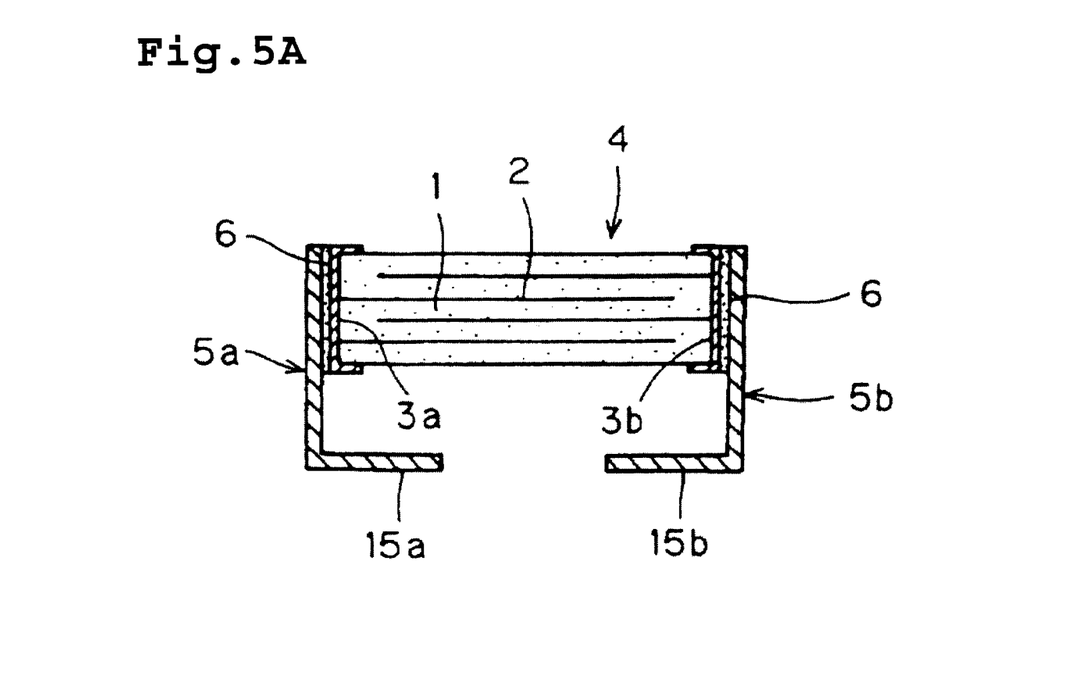
FIGS. 5A and 5B are a front sectional view and a side view of a modification of the second embodiment of the ceramic electronic part in accordance with the present invention.
Figure 5B:
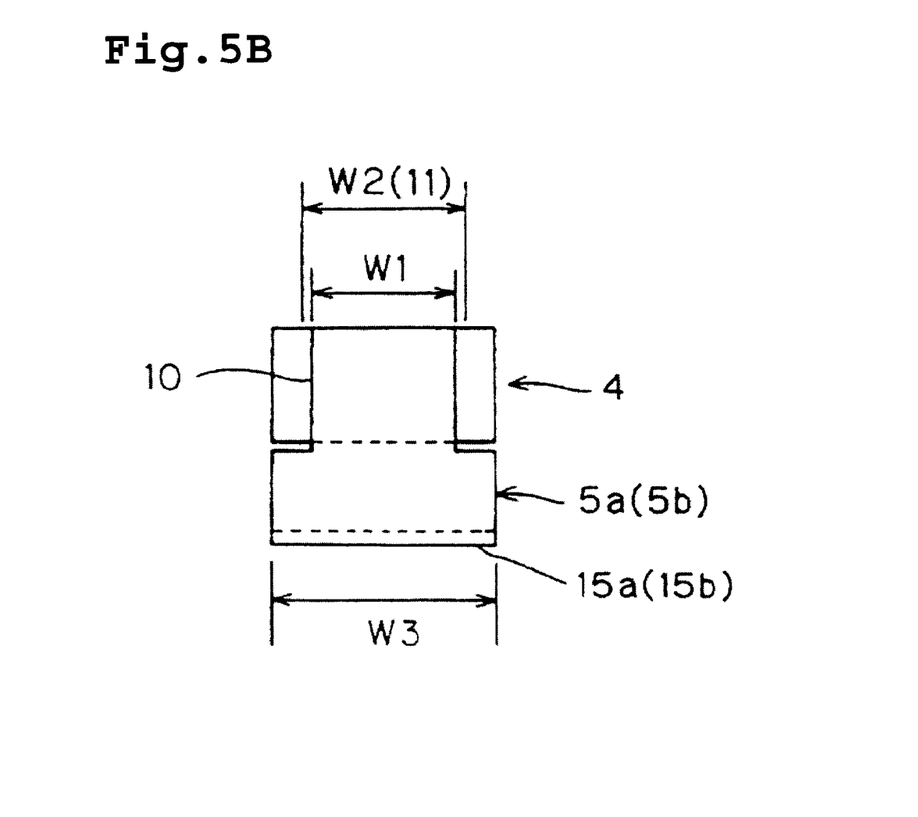

As shown in FIGS. 5A and 5B, the ceramic electronic part of the second embodiment can be constructed so that the end side portions of the external terminals 5a and 5b are bent inward.

Figure 6A:
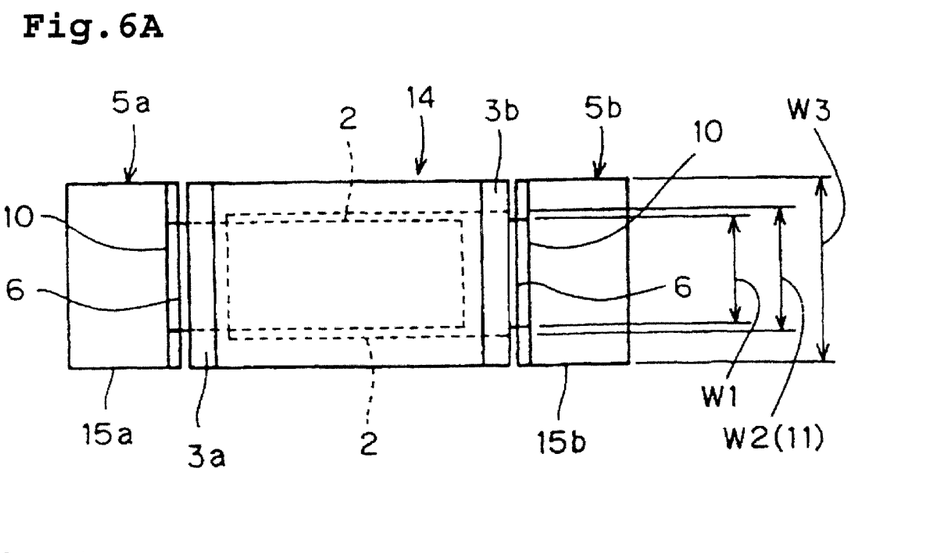
FIGS. 6A, 6B, and 6C are a plan view, a front sectional view, and a side view of another modification of the second embodiment of the ceramic electronic part in accordance with the present invention.
Figure 6B:
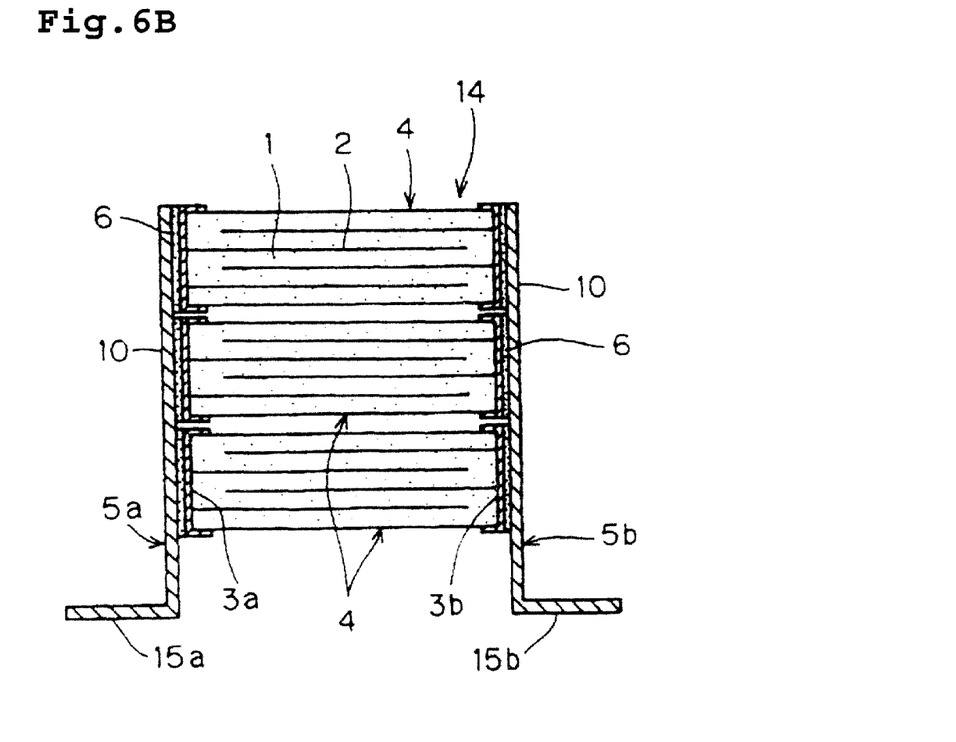
Figure 6C:
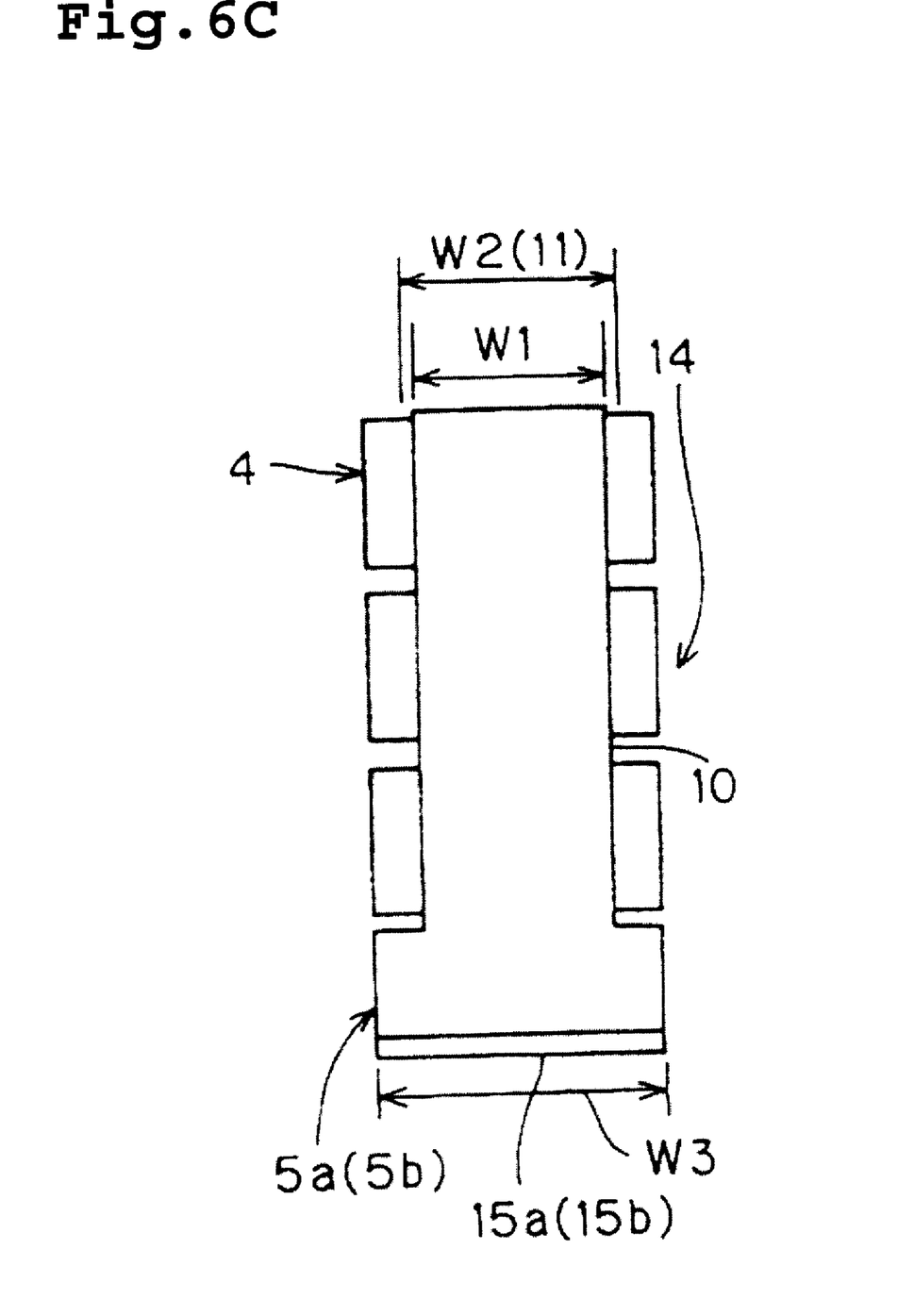

A stacked-type ceramic electronic part shown in FIGS. 6A, 6B, and 6C may also be used. In the stacked-type ceramic electronic part, external terminals 5a and 5b with widthwise dimensions approximately equal to the widthwise dimension of the element 4 are joined to both end surfaces of a ceramic electronic part element (a stacked-type element) 14 formed by stacking a plurality of ceramic electronic part elements 4 (three ceramic electronic part elements in the embodiment), with widths W1 of joining portions 10 being equal to or less than widths W2 of internal electrodes 2, and widths W3 of portions other than the joining portions 10 being greater than the widths W2 of the internal electrodes 2 disposed in the ceramic electronic elements 4.

Figure 7:
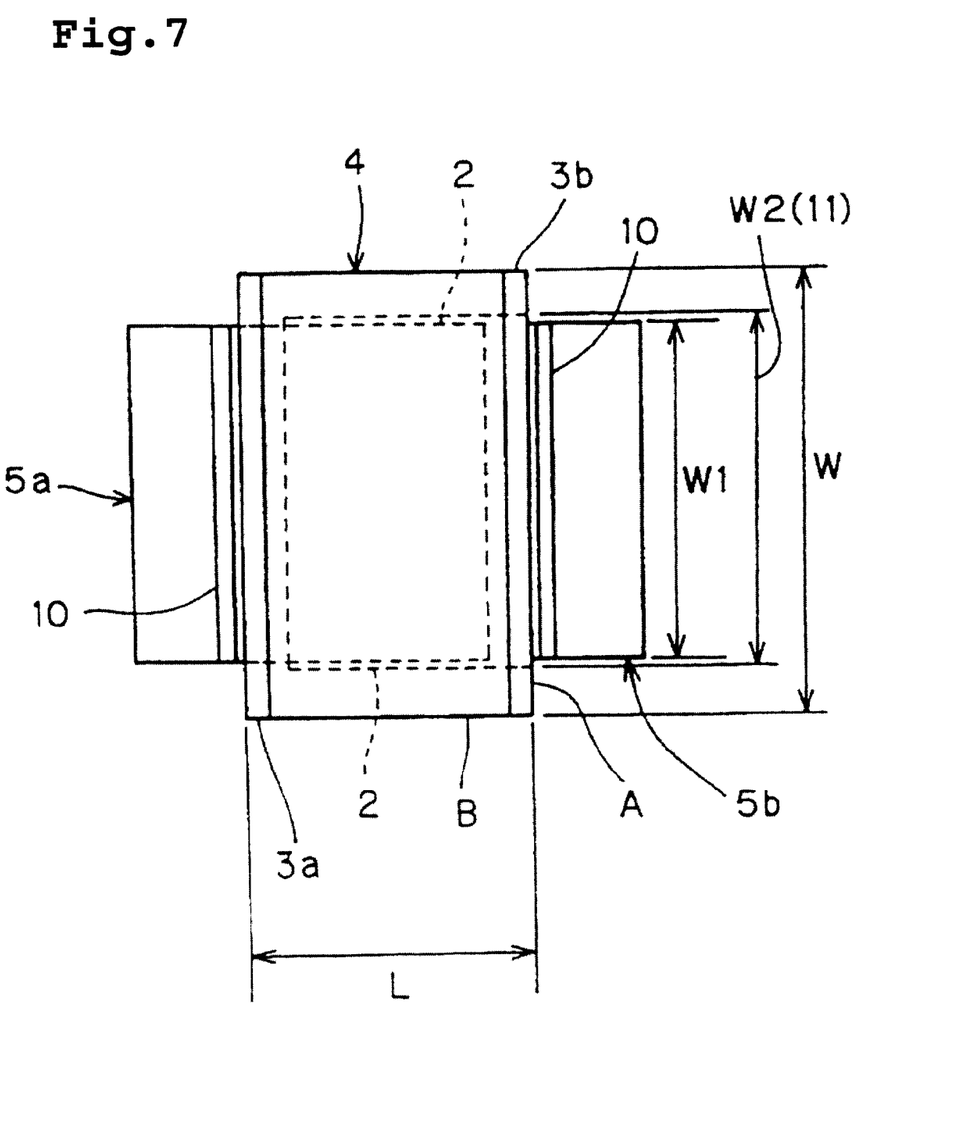
FIG. 7 is a plan view of a ceramic electronic part in accordance with the present invention.

In the first and second embodiments, the ceramic electronic element 4 when viewed in a plane is such that the lengths (width) W of the sides A of the end surfaces to which the external terminals 5a and 5b are mounted are smaller than the lengths L of the sides B that are perpendicular to the sides A. In contrast, as shown in FIG. 7, the form of the ceramic electronic element 4 when viewed in a plane may be such that widths W of sides A of end surfaces to which the external terminals 5a and 5b are mounted are greater than lengths L of sides B that are perpendicular to the sides A. In such a ceramic electronic element, stress tends to be produced between the external terminals 5a and 5b and the ceramic electronic part element, so that the production of cracks frequently becomes a problem. However, it is particularly worthwhile to apply the present invention to such a ceramic electronic part because the application of the present invention reduces cracking, making the ceramic electronic part highly reliable.

Although in the above-described embodiments the external terminals are silver plates, various other types of plates may also be used for the external terminals. They include metallic plates other than silver plates, such as plates made of copper, nickel, iron, aluminum, tin, zinc, or titanium, or alloy plates consisting of any one of the aforementioned metals as a major constituent.

Although in the above-described embodiments the external terminals are joined by a bonding material, such as solder, an electrically conductive adhesive, or an electrically conductive paste, methods such as high-frequency welding may also be used.

Although in the above-described embodiments a layered ceramic capacitor is used, there may also be used other types of ceramic electronic parts in which the external terminals are disposed on a surface of the ceramic electronic part element including internal electrodes so that they are in electrical conduction with the internal electrodes. In particular, the present invention can be effectively applied to ceramic electronic parts with many internal electrodes stacked upon each other (such as 100 internal electrodes) or with a large ceramic electronic part element (having, for example, dimensions L×W equal to or greater than 3.2 mm×1.6 mm, or in particular an L or W equal to or greater than 10 mm).

The present invention is not limited to the above-described embodiments as regards other structural features, so that within the scope of the gist of the invention various uses or modifications can be made as regards, for example, the type of ceramic of the ceramic electronic part element, the pattern and the material of the internal electrodes, or the location where the external terminals are disposed.

As described above, according to the first form of the ceramic electronic part of the present invention, the width of a portion of the external terminal that is joined to an end surface of the ceramic electronic part element is equal to or less than the width of the internal electrode disposed in the ceramic electronic part element. Therefore, the external terminal or an external electrode can be joined to a portion having a linear expansion coefficient closer to the linear expansion coefficient of metal than the linear expansion coefficient of a portion including only ceramic, making it possible to reduce the amount of stress generated in a heat cycle test to reduce cracking.

According to the second form of the present invention, an external electrode is joined to the end surface of the ceramic electronic part element so that the joining portion of the external terminal is positioned within an area of the end surface of the ceramic electronic part element where the internal electrode is exposed when viewed in a plane. Therefore, the external terminal can be reliably joined to a portion having a linear expansion coefficient closer to the linear expansion coefficient of the metal than the linear expansion coefficient of a portion including only ceramic. Consequently, it is possible to reduce the amount of stress produced in a heat cycle test to reduce cracking.

According to the third form of the present invention, when a width of a portion of the external terminal that is joined to the end surface of the ceramic electronic part element is equal to or less than a width of the internal electrode disposed in the ceramic electronic part element, or when the joining portion of the external terminal is joined to the end surface of the ceramic electronic part element so as to be positioned within an area of the end surface of the ceramic electronic part element where the internal electrode is exposed when viewed in a plane, the ceramic electronic part element may be formed by stacking a plurality of ceramic electronic part elements upon each other. Therefore, the external terminal can be reliably joined to a portion having a linear expansion coefficient closer to the linear expansion coefficient of the metal than the linear expansion coefficient of a portion including only ceramic. Consequently, it is possible to reduce the amount of stress produced in a heat cycle test to reduce cracking.

According to the fourth form of the present invention, when a width of a portion of the external terminal that is joined to the end surface of the ceramic electronic part element is equal to or less than a width of the internal electrode disposed in the ceramic electronic part element, or when the joining portion of the external terminal is joined to the end surface of the ceramic electronic part element so as to be positioned within an area of the end surface of the ceramic electronic part element where the internal electrode is exposed when viewed in a plane, or when the ceramic electronic part element is formed by stacking a plurality of ceramic electronic part elements upon each other, a width of at least a portion of the external terminal other than the joining portion that is joined to the ceramic electronic part element may be made larger than the width of the internal electrode disposed in the ceramic electronic part element. Therefore, for example, when the external terminal is joined to a land of a base, the joining area can be made large to achieve more reliable mounting, making it possible to design the ceramic electronic part with more freedom while maintaining its reliability.

According to the fifth form of the present invention, when a width of a portion of the external terminal that is joined to the end surface of the ceramic electronic part element is equal to or less than a width of the internal electrode disposed in the ceramic electronic part element, or when the joining portion of the external terminal is joined to the end surface of the ceramic electronic part element so as to be positioned within an area of the end surface of the ceramic electronic part element where the internal electrode is exposed when viewed in a plane, or when the ceramic electronic part element is formed by stacking a plurality of ceramic electronic part elements upon each other, or when a width of at least a portion of the external terminal other than the joining portion that is joined to the ceramic electronic part element is made larger than the width of the internal electrode disposed in the ceramic electronic part element, the form of the ceramic electronic part element when viewed in a plane may be such that a length (width) W of a side A of the end surface to which the external terminal is mounted is greater than a length L of a side B perpendicular to the side A. When the length of side A is longer than the length of side B, stress is often produced between the external terminal and the ceramic electronic part element, so that cracks are often produced. However, when the present invention is applied to such a ceramic electronic part, cracking can be reduced, making the ceramic electronic part highly reliable. Therefore, it is particularly worthwhile to apply the present invention to such a ceramic electronic part.

Although the present invention has been described in relation to particular embodiments thereof, many other variations and modifications and other uses will become apparent to those skilled in the art. Therefore, the present invention is not limited by the specific disclosure herein.

What is claimed is:

1. A ceramic electronic part comprising:
a ceramic electronic part element having a plurality of stacked internal electrodes disposed in ceramic, each internal electrode being isolated from each other internal electrode by the ceramic, with a portion of each internal electrode being exposed at one of two end surfaces of the ceramic electronic part element, an opposite portion of each internal electrode not being exposed at an end surface, respective ones of the internal electrodes alternately extending to opposite end surfaces of the electronic part element; and
a pair of external terminals, each external terminal being an electrically conductive material and joined to a respective one of the two end surfaces of the ceramic electronic part element so as to be in electrical conduction with respective ones of the internal electrodes exposed at the respective one of the two end surfaces of the ceramic electronic part element;
wherein a portion of each external terminal that is joined to the respective end surface of the ceramic electronic part element has a width that is equal to or less than a width of the internal electrodes disposed in the ceramic electronic part element.

2. A ceramic electronic part according to claim 1, wherein the joining portion of the external terminal is joined to the end surface of the ceramic electronic part element so as to be positioned within an area of the end surface of the ceramic electronic part element where the internal electrode is exposed when viewed in a plane.

3. A ceramic electronic part according to claim 2, wherein the ceramic electronic part element is formed by stacking a plurality of ceramic electronic part elements upon each other.

4. A ceramic electronic part according to claim 1, wherein the ceramic electronic part element is formed by stacking a plurality of ceramic electronic part elements upon each other.

5. A ceramic electronic part according to any one of claims 1 to 4, wherein the form of the ceramic electronic part element when viewed in a plane is such that a width W of a side A of the end surface to which the external terminal is mounted is greater than a length L of a side B perpendicular to the side A.

6. A ceramic electronic part according to claim 5, wherein at least a portion of the external terminal other than a joining portion that is joined to the ceramic electronic part element has a width that is larger than the width of the internal electrode disposed in the ceramic electronic part element.

7. A ceramic electronic part according to any one of claims 1 to 4, wherein at least a portion of the external terminal other than a joining portion that is joined to the ceramic electronic part element has a width that is larger than the width of the internal electrode disposed in the ceramic electronic part element.

8. A ceramic electronic part according to any one of claims 1 to 4, wherein said external terminal is provided with a cut-out portion.

9. A ceramic electronic part according to claim 1, wherein only the end portion of the internal electrode disposed in ceramic is exposed outside the ceramic.

10. A ceramic electronic part according to claim 1, wherein the internal electrode is encased in ceramic with the exception of the end portion exposed outside the ceramic.

11. A ceramic electronic part comprising:
a ceramic electronic part element having a plurality of internal electrodes disposed in ceramic, with a portion of each internal electrode being exposed at a respective one of two end surfaces of the ceramic electronic part element; and
a pair of external terminals each comprising an electrically conductive material joined to a respective one of the two end surfaces of the ceramic electronic part element so as to be in electrical conduction with respective ones of the internal electrodes exposed at the respective one of the two end surfaces of the ceramic electronic part element;
wherein a portion of each external terminal that is joined to the respective end surface of the ceramic electronic part element has a width that is equal to or less than a width of the internal electrodes disposed in the ceramic electronic part element;
and further wherein the plurality of internal electrodes are disposed in a stacked arrangement, with alternating ones of said internal electrodes being connected to respective ones of said pair of external terminals, the internal electrodes being substantially the same size.

12. A ceramic electronic part comprising:
a ceramic electronic part element having a plurality of internal electrodes disposed in ceramic, with a portion of each internal electrode being exposed at a respective one of two end surfaces of the ceramic electronic part element; and
a pair of external terminals each comprising an electrically conductive material joined to a respective one of the two end surfaces of the ceramic electronic part element so as to be in electrical conduction with respective ones of the internal electrodes exposed at the respective one of the two end surfaces of the ceramic electronic part element;
wherein a portion of each external terminal that is joined to the respective end surface of the ceramic electronic part element has a width that is equal to or less than a width of the internal electrodes disposed in the ceramic electronic part element;
wherein the internal electrodes are surrounded by ceramic except where the internal electrodes connect a single one of external terminals.

13. A ceramic electronic part comprising:
a ceramic electronic part element having a plurality of internal electrodes disposed in ceramic, with a portion of each internal electrode being exposed at a respective one of two end surfaces of the ceramic electronic part element; and
a pair of external terminals each comprising an electrically conductive material joined to a respective one of the two end surfaces of the ceramic electronic part element so as to be in electrical conduction with respective ones of the internal electrodes exposed at the respective one of the two end surfaces of the ceramic electronic part element;
wherein a portion of each external terminal that is joined to the respective end surface of the ceramic electronic part element has a width that is equal to or less than a width of the internal electrodes disposed in the ceramic electronic part element;
and further wherein the plurality of internal electrodes are disposed in a stacked arrangement, with alternating ones of said internal electrodes being connected to respective ones of said pair of external terminals, the internal electrodes being substantially the same size;

further wherein the ceramic electronic part comprises a capacitor having a capacitance, the capacitance being established between said pair of external terminals connected to alternating ones of said internal electrodes.

* * * * *